(12) United States Patent
Meyer et al.

(10) Patent No.: US 6,797,585 B1
(45) Date of Patent: Sep. 28, 2004

(54) NONINTRUSIVE WAFER MARKING

(75) Inventors: Theodore O. Meyer, Portland, OR (US); Nima Behkami, Portland, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/680,047

(22) Filed: Oct. 7, 2003

(51) Int. Cl.[7] .............................................. H01L 21/76
(52) U.S. Cl. ........................ 438/401; 438/16; 438/800
(58) Field of Search ............................. 438/14, 16, 401, 438/800; 257/620, 627, 797, 798

(56) References Cited

U.S. PATENT DOCUMENTS

| | | | |
|---|---|---|---|
| 6,004,405 A | * 12/1999 | Oishi et al. | 438/401 |
| 6,182,729 B1 | * 2/2001 | Banzawa et al. | 156/353 |
| 6,420,792 B1 | * 7/2002 | Guldi et al. | 257/797 |
| 6,482,661 B1 | * 11/2002 | Madoyski | 438/14 |
| 2002/0001536 A1 | 1/2002 | Guldi et al. | |
| 2003/0001416 A1 | 1/2003 | Lee et al. | |

* cited by examiner

Primary Examiner—Kevin M. Picardat
(74) Attorney, Agent, or Firm—Luedeka, Neely & Graham, P.C.

(57) ABSTRACT

A method for marking a wafer that is cut from a boule. A surface of the boule is marked with an encoded marking that extends completely along a distance of the boule that is used for cutting wafers. The encoded marking is disposed substantially parallel to a length axis of the boule. The wafer is cut from the boule from within the distance, such that the encoded marking along the surface of the boule is disposed at a peripheral edge of the wafer. The encoded marking contains information in regard to the wafer.

20 Claims, 1 Drawing Sheet

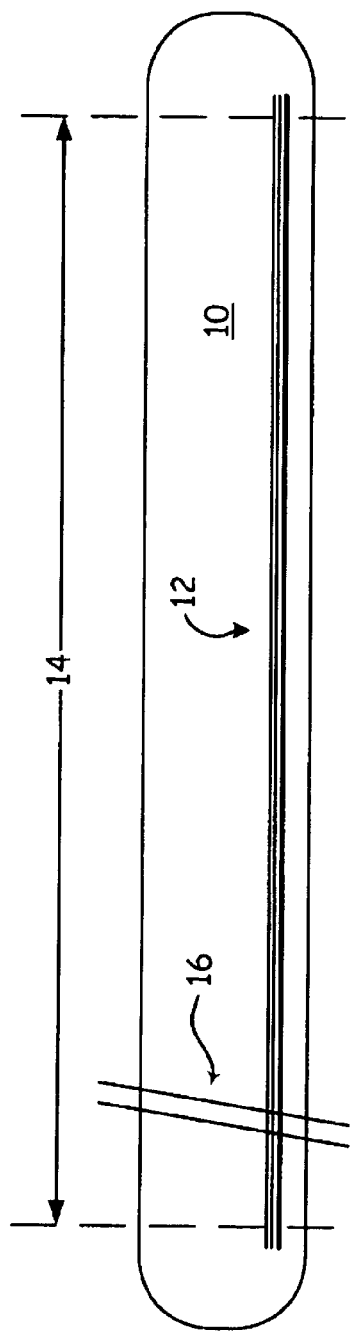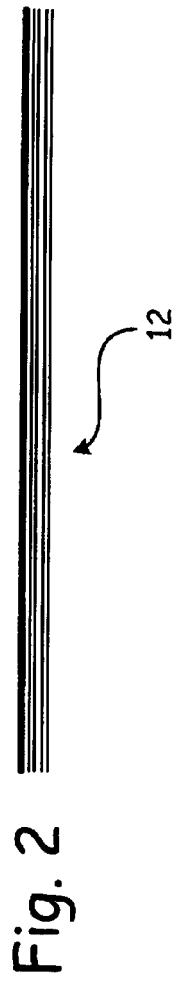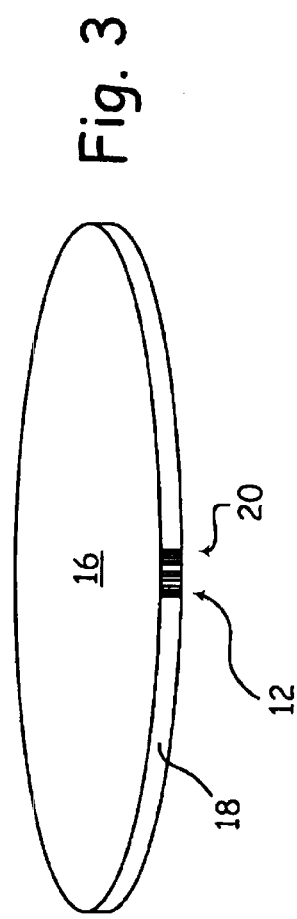

NONINTRUSIVE WAFER MARKING

FIELD

This invention relates to the field of integrated circuit fabrication. More particularly, this invention relates to marking the substrates on which integrated circuits are formed so that the substrates can be associated with various pieces of information.

BACKGROUND

Monolithic integrated circuits are typically formed on substrates of semiconducting material, commonly called wafers. In general; wafers are fabricated by starting with a single seed crystal that is held at a specific crystallographic orientation and lowered into a melt of molten semiconducting material. For example, the semiconducting material may be one of silicon, germanium, a III–V compound such as gallium arsenide, or a mixture of such materials.

As the seed crystal is slowly withdrawn from the melt, material from the melt solidifies to it in the same crystallographic orientation as the seed crystal is held. By slowing withdrawing the seed crystal, a long cylindrical ingot of the semiconducting material, called a boule, is formed. Individual wafers are sliced from the boule at a desired angle to the axis of the boule. The wafers are then shaped to be circular and one side of the wafer is polished in anticipation for the integrated circuit processing to be performed thereon.

At some point in the wafer fabrication process, two modifications are made to the wafer. First, some type of feature is added to the wafer so that it can be repeatedly physically oriented to a known position at later points in time. For some wafers this feature is called a flat, where a portion of the peripheral circular curvature of the wafer is ground to a flat shape, and for other wafers this feature is called a notch, where a small circular portion is etched into the peripheral edge of the wafer.

The second type of modification is the addition of an identification to the wafer, typically called a wafer scribe. The wafer scribe usually consists of a string of alpha numeric characters that are etched into the top surface of the wafer, such as by laser ablation. The wafer scribe allows the wafer manufacturer to identify the wafer, such as with information as to the place of fabrication, the date of fabrication, and boule from which the wafer was cut. Typically, the final polishing of the wafer, as introduced above, is performed after the identification mark and orientation feature are formed.

Unfortunately, both the identification mark and the orientation feature tend to reduce the amount of surface area on the wafer that is available for the fabrication of integrated circuits. Because the identification mark is typically formed by recessing the surface of the wafer on which the integrated circuits are formed, the surface of the wafer in the region of the identification mark is rendered inadequate for the formation of integrated circuits. Further, the orientation feature typically removed a portion of the wafer, thus reducing the amount of surface area available for the formation of integrated circuits.

There have also been other problems reported with the use of traditional orientation features and identification marks. For example, notches need to be kept clean of processing materials, or they tend to contaminate the wafer or otherwise disrupt the desired processing of the integrated circuits. Identification marks must also be kept clean and free of circuitry, or they cannot be read and used to identify the wafer in the manner intended. Thus, traditional orientation features and identifications marks have drawbacks associated with their use.

What is needed, therefore, is a system for orienting or identifying wafers which overcomes at least some of the problems identified above.

SUMMARY

The above and other needs are met by a method for marking a wafer that is cut from a boule. A surface of the boule is marked with an encoded marking that extends completely along a distance of the boule that is used for cutting wafers. The encoded marking is disposed substantially parallel to a length axis of the boule. The wafer is cut from the boule from within the distance, such that the encoded marking along the surface of the boule is disposed at a peripheral edge of the wafer. The encoded marking contains information in regard to the wafer.

In this manner, the boule is marked in a way that is easily accomplished, and which is retained in each wafer as it is cut from the boule. Further, the marking that is formed on the surface of the boule, and which is disposed at the peripheral edge of the wafer, can be used for physically orienting the wafer, and also for identifying the wafer. Thus, the encoded marking is able to function both as an identification mark and an orientation feature. Further, the encoded marking at the peripheral edge of the wafer does not significantly reduce the amount of surface area available on the wafer for the fabrication of integrated circuits. Further yet, the nature of the encoded marking reduces the degree to which the encoded marking impacts the processing of the integrated circuits on the wafer, such as from contamination or flow disruptions.

In various embodiments, there is an additional step of rounding the peripheral edge of the wafer in a manner that does not remove the encoded marking. The wafer is preferably formed of a semiconducting material, and most preferably the wafer is formed of at least one of silicon, germanium, and a III–V compound. The step of marking the surface of the boule preferably includes laser ablating substantially parallel lines in the surface of the boule. In another embodiment the step of marking the surface of the boule includes printing substantially parallel lines on the surface of the boule. The step of rounding the surface of the boule is accomplished prior to marking the surface of the boule in some embodiments. Preferably, the encoded marking comprises a bar code. The information preferably includes at least one of an index number, a wafer manufacturer identification, a date of manufacture, a location of manufacture, and a boule identification. Most preferably there is an additional step of adding a wafer identification to the encoded marking on the wafer, where the wafer identification is unique relative to the boule. Also described is a wafer marked by the method of claim 1.

According to another aspect of the invention there is described a method for identifying a wafer that is cut from a boule. A surface of the boule is marked with an encoded marking that extends completely along a distance of the boule that is used for cutting wafers. The encoded marking is disposed substantially parallel to a length axis of the boule. The wafer is cut from the boule from within the distance, such that the encoded marking along the surface of the boule is disposed at a peripheral edge of the wafer. The encoded marking contains information in regard to the wafer. The encoded marking on the peripheral edge of the wafer is read, and the wafer is thus identified.

In various embodiments the wafer is formed of a semiconducting material. Preferably, the step of marking the surface of the boule includes laser ablating substantially parallel lines in the surface of the boule. Most preferably, the encoded marking comprises a bar code. A wafer identification that is unique relative to the boule is preferably added after the step of cutting the wafer from the boule.

According to yet another aspect of the invention there is described a method for positioning a wafer that is cut from a boule in a known physical orientation. A surface of the boule is marked with an encoded marking that extends completely along a distance of the boule that is used for cutting wafers. The encoded marking is disposed substantially parallel to a length axis of the boule, and at a known location relative to a physical orientation of the boule. The wafer is cut from the boule from within the distance, such that the encoded marking along the surface of the boule is disposed at a peripheral edge of the wafer. The wafer is rotated, and the encoded marking on the peripheral edge of the wafer is detected as the wafer rotates. The rotation of the wafer is stopped when the encoded marking on the peripheral edge of the wafer is disposed in a desired position.

In various embodiments, the step of marking the surface of the boule includes laser ablating substantially parallel lines in the surface of the boule. Preferably, the encoded marking comprises a bar code. A wafer identification that is unique relative to the boule is preferably added after the step of cutting the wafer from the boule.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1 depicts a boule, showing an encoded marking and an orientation of a wafer to be cut from the boule.

FIG. 2 depicts a more detailed embodiment of the encoded-marking on the boule of FIG. 1.

FIG. 3 depicts the encoded marking on the peripheral edge of the wafer cut from the boule.

DETAILED DESCRIPTION

With reference now to FIG. 1, there is depicted a boule 10, such as is formed as described above. Preferably, the boule 10 is formed of a semiconducting material, and is most preferably formed of at least one of silicon, germanium, and a III–V compound such as gallium arsenide.

The boule 10 is preferable rounded, so as to make the boule 10 highly cylindrical. This step is performed so that the wafers 16 to be cut from the boule 10 are highly round and substantially uniform in diameter. The surface of the boule 10 is preferably marked with encoded markings 12 that extend substantially contiguously through a usable length 14 of the boule 10 that will be used for cutting wafers 16. It is appreciated that the usable length 14 of the boule 10 may or may not be contiguous. However, it is a preferred aspect of the invention that the encoded markings 12 extend substantially contiguously through each usable length 14 that is found on the boule 10, even though the encoded markings 12 for each such section 14 are not all contiguous, from one section 14 to another.

In a most preferred embodiment, the encoded markings 12 are formed by laser ablating the surface of the boule 10 to a degree that is sufficient such that the markings 12 can be visually detected, but not nearly so deep as a traditional notch or flat. Preferably, the encoded markings 12 are formed to about the same depth as is traditionally used for a laser scribe identification marking that is customarily placed on the surface of a wafer. Alternately, the encoded markings 12 can be formed such as by printing on the surface of the boule 10, or by scribing the surface of the boule 10 with a method other than by laser ablation.

The markings 12 are preferably formed as lines that are substantially parallel to the axis along the length of the boule 10. Thus, in the most preferred embodiment, the markings 12 do not spiral around the boule 10, although in some embodiments they could do so. Further, the markings 12 are preferably substantially uniform down the length 14. In other words, the markings 12 appear substantially identical from one portion of the length 14 to another portion of the length 14. It is appreciated that a digital laser ablation process, and other processes, form "lines" from dots that may or may not be touching one another. Thus, for the purposes of this disclosure, such contiguous series of dots are considered to be an uninterrupted "line."

In a most preferred embodiment, the markings 12 are formed on the surface of the boule 10 in a location that is known with respect to an orientation of the boule 10, such as a crystallographic orientation of the boule 10. This is one reason why the markings 12 are preferably formed as straight lines that are parallel to the axis of the boule 10, and do not spiral or otherwise shift around the boule 10 from one position to another. The benefit of such a configuration is described with greater detail hereafter.

The encoded markings 12 preferably contain some amount of encoded information in regard to the boule 10, such as but not limited to an index number, a wafer manufacturer identification, a date of manufacture, a location of manufacture, and a boule 10 identification. Thus, by decoding the information within the markings 12, the origin of the boule 10, and other information in regard to the boule 10, can preferably be reconstructed.

The wafers 16 are preferably cut from the boule 10, such as at a desired angle as generally indicated in FIG. 1. The description provided herein uses various forms of the verb "cut" to describe the process by which the wafers 16 are singulated from the boule 10. It is appreciated that such usage is intended to refer to various methods by which such wafer 16 singulation may be performed, such as for example sawing, burning, chipping, and grinding, and is not intended to limit this disclosure to a classical cutting methodology or any other specific singulation methodology.

FIG. 2 provides a more detailed depiction of the encoded markings 12 on the surface of the boule 10. In a preferred embodiment, the markings 12 include encoded information within their structure, such as for example within the number, width, and spacing of parallel lines. In a most preferred embodiment, the markings 12 are formed in one of the many recognizable bar code patterns, or a new bar code pattern, as such patterns are understood in the art. Thus, the markings 12 are preferably detectable and readable such as with a traditional bar code reader or other scanning device.

FIG. 3 depicts the orientation of the markings 12 on the peripheral edge of the wafer 16 after it has been singulated. As depicted in FIG. 3, the markings 12 do not substantially interfere with the usable surface area on the top surface of the wafer 16. Most preferably, a wafer identification 20 is added to the peripheral edge 18 of the wafer 16, such as at a position that is near the markings 12, after the wafer 16 has been singulated. The wafer identification 20 is preferably added such as by using the same marking method that was employed to form the markings 12. However, in other embodiments a different marking method may be used to form the wafer identification 20.

If the boule 10 was not rounded prior to forming the markings 12 on the surface of the boule 10, or if additional rounding of the wafer 16 is needed, then the wafer 16 may be rounded after it is singulated from the boule 10. Most preferably, the rounding process does not remove the markings 12, or the markings 20 if they are formed prior to the final rounding process. Most preferably, the markings 12 and 20 are formed to a depth within the surface of the boule 10, or the peripheral edge 18 of the wafer 16, that is sufficient to remain after any such subsequent rounding process.

The wafer identification 20 preferably contains information in regard to the position of the wafer 16 within the boule 10, such as a serialized number that starts at one end of the boule 10, and is incremented as wafers 16 are formed toward the other end of the boule 10. Thus, the wafer identification 20 preferably does not provide detailed information in regard to other properties or characteristics of the wafer 16.

A wafer 16 that is formed as described above and as depicted in FIG. 3 has many benefits, and can be used in a variety of beneficial ways. For example, the markings 12, and the markings 20 if present, can be used to either identify the wafer 16 or physically orient the wafer 16, or both, as desired. Specifically, at various points in the processing of the integrated circuits to be formed on the surface of the wafer 16, the markings 12 and 20 can be read to confirm that the wafer 16 is at the proper processing station. Or if there is a problem with the wafer 16 or the integrated circuits formed thereon, the markings 12, and possibly also the markings 20, can be used to try to track down the source of such problems. Thus, the markings 12 obviate the need for a traditional laser scribe indicia on the top surface or back side of the wafer 16.

Additionally the markings 12, and the markings 20 if present, can be used to physically orient the wafer 16, such as by rotating the wafer 16 on a chuck, while using a scanner or other device to detect the markings 12 or 20 on the peripheral edge 18 of the wafer 16. When the locations of the markings 12 or 20 are detected, the chuck can stop the wafer 16 in a desired physical orientation relative to the markings 12 or 20. With a knowledge of how the markings 12 were oriented in reference to the boule 10, as described above, such information as the crystallographic orientation of the wafer 16 can be determined from the markings 12. Thus, the markings 12 obviate the need for a wafer notch or flat.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for marking a wafer that is cut from a boule, the method comprising the sequential steps of:
   marking a surface of the boule with encoded markings that extends substantially contiguously along a distance of the boule that is used for cutting wafers, where the encoded markings are disposed substantially parallel to a length axis of the boule, and
   cutting the wafer from the boule from within the distance, such that the encoded markings along the surface of the boule are disposed at a peripheral edge of the wafer,
   where the encoded markings contains information in regard to the wafer.

2. The method of claim 1, further comprising the step of rounding the peripheral edge of the wafer in a manner that does not remove the encoded marking.

3. The method of claim 1, wherein the wafer is formed of a semiconducting material.

4. The method of claim 1, wherein the wafer is formed of at least one of silicon, germanium, and a III–V compound.

5. The method of claim 1, wherein the step of marking the surface of the boule comprises laser ablating substantially parallel lines in the surface of the boule.

6. The method of claim 1, wherein the step of marking the surface of the boule comprises printing substantially parallel lines on the surface of the boule.

7. The method of claim 1, further comprising the step of rounding the surface of the boule prior to marking the surface of the boule.

8. The method of claim 1, wherein the encoded markings comprises a bar code.

9. The method of claim 1, wherein the information includes at least one of an index number, a wafer manufacturer identification, a date of manufacture, a location of manufacture, and a boule identification.

10. The method of claim 1, further comprising the step of adding to the encoded markings on the wafer, a wafer identification that is unique relative to the boule, after the step of cutting the wafer from the boule.

11. A wafer marked by the method of claim 1.

12. A method for identifying a wafer that is cut from a boule, the method comprising the sequential steps of:
   marking a surface of the boule with encoded markings that extends substantially contiguously along a distance of the boule that is used for cutting wafers, where the encoded markings are disposed substantially parallel to a length axis of the boule,
   cutting the wafer from the boule from within the distance, such that the encoded markings along the surface of the boule is disposed at a peripheral edge of the wafer,
   where the encoded markings contains information in regard to the wafer, and
   reading the encoded markings on the peripheral edge of the wafer to identify the wafer.

13. The method of claim 12, wherein the wafer is formed of a semiconducting material.

14. The method of claim 12, wherein the step of marking the surface of the boule comprises laser ablating substantially parallel lines in the surface of the boule.

15. The method of claim 12, wherein the encoded markings comprises a bar code.

16. The method of claim 12, further comprising the step of adding to the encoded markings on the wafer, a wafer identification that is unique relative to the boule, after the step of cutting the wafer from the boule.

17. A method for positioning a wafer that is out from a boule in a known physical orientation, the method comprising the sequential steps of:

marking a surface of the boule with encoded markings that extends substantially contiguously along a distance of the boule that is used for cutting wafers, where the encoded markings are disposed substantially parallel to a length axis of the boule, and where the encoded markings are disposed at a known location relative to a physical orientation of the boule, cutting the wafer from the boule within the distance, such that the encoded markings along the surface of the boule is disposed at a peripheral edge of the wafer, rotating the wafer, detecting the encoded markings on the peripheral edge of the wafer as the wafer rotates, and stopping the rotation of the wafer when the encoded markings on the peripheral edge of the wafer are disposed in a desired position.

18. The method of claim 17, wherein the step of marking the surface of the boule comprises laser ablating substantially parallel lines in the surface of the boule.

19. The method of claim 17, wherein the encoded markings comprises a bar code.

20. The method of claim 17, further comprising the step of adding to the encoded markings on the wafer, a wafer identification that is unique relative to the boule, after the step of cutting the wafer from the boule.

* * * * *